(12) United States Patent
Taninaka et al.

(10) Patent No.: US 6,765,235 B2
(45) Date of Patent: Jul. 20, 2004

(54) ARRAY OF SEMICONDUCTOR ELEMENTS WITH PAIRED DRIVING SCHEME

(75) Inventors: Masumi Taninaka, Hachioji (JP);
Hiroyuki Fujiwara, Hachioji (JP);
Hiroshi Hamano, Hachioji (JP);
Masaharu Nobori, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/373,404

(22) Filed: Feb. 25, 2003

(65) Prior Publication Data

US 2003/0160255 A1 Aug. 28, 2003

(30) Foreign Application Priority Data

Feb. 27, 2002 (JP) ........................................ 2002-051261

(51) Int. Cl.[7] ........................ H01L 33/00; H01L 23/495
(52) U.S. Cl. ........................... 257/88; 257/91; 257/92; 257/99; 257/676
(58) Field of Search ................................ 257/88, 92, 91, 257/99, 676; 362/800, 240, 249, 368; 347/238, 237

(56) References Cited

U.S. PATENT DOCUMENTS

| 5,942,770 A | 8/1999 | Ishinaga et al. |
| 6,190,935 B1 | 2/2001 | Ogihara et al. |
| 6,313,483 B1 * | 11/2001 | Ogihara et al. ............... 257/79 |

FOREIGN PATENT DOCUMENTS

| JP | 10-181077 A | 7/1998 |
| JP | 410181077 | * 7/1998 |

OTHER PUBLICATIONS

Ogihara, Misuhiko, et al., "1200 DPI Light Emitting Diode Array for Optical Printer Print Heads," 1996 International Conference on Solid State Devices and Materials, Yokohama, pp. 604–606 (1996).

* cited by examiner

Primary Examiner—Minhloan Tran
Assistant Examiner—Tan Tran
(74) Attorney, Agent, or Firm—Akin Gump Strauss Hauer & Feld, LLP (57) ABSTRACT

A semiconductor device has a substantially linear array of semiconductor blocks of one conductive type, each includes a diffusion region of the opposite conductive type and a electrode. The array is paralleled by an array of electrode pads, each connected to two semiconductor blocks, being connected to the diffusion region in one of the two semiconductor blocks and to the electrode in the other one of the two semiconductor blocks. The electrode pad can thus activate both semiconductor blocks, activating one semiconductor block when placed at one potential, and activating the other semiconductor block when placed at another potential. Efficient driving with a comparatively small number of electrode pads thus becomes possible.

15 Claims, 12 Drawing Sheets

ARRAY OF SEMICONDUCTOR ELEMENTS WITH PAIRED DRIVING SCHEME

BACKGROUND OF THE INVENTION

1. Field of the Invention

The present invention relates to an array of semiconductor elements such as light-emitting diodes, and more particularly to the connections and layout of the wire-bonding electrode pads of the array.

2. Description of the Related Art

Figure 18:
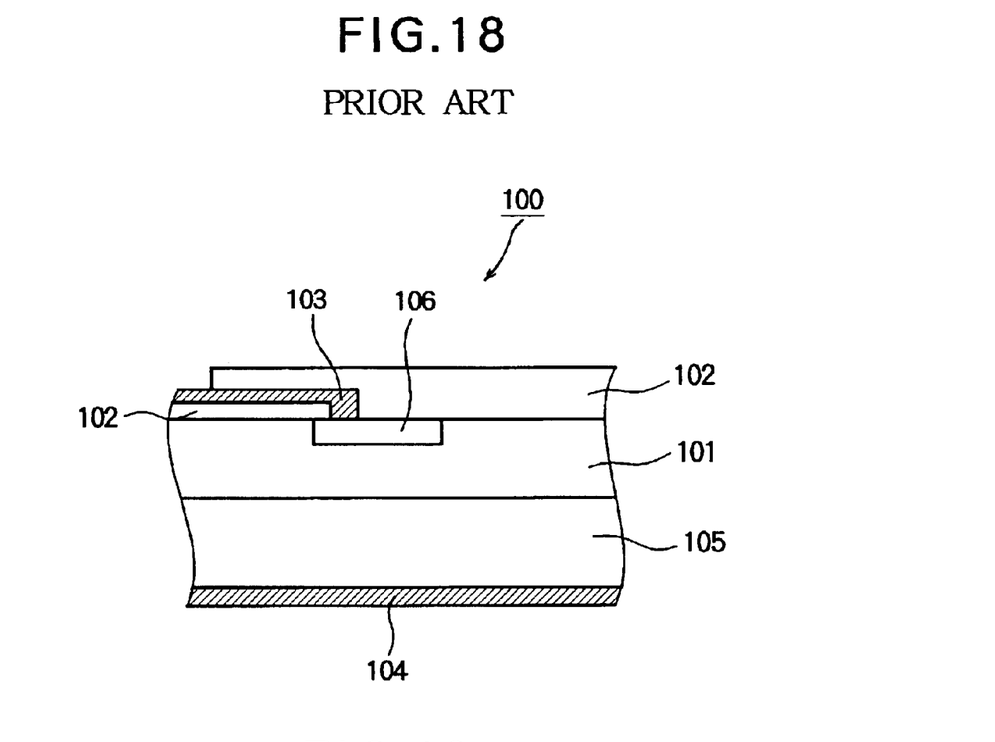
FIG. 18 is a sectional drawing illustrating a conventional LED array.
Figure 19:
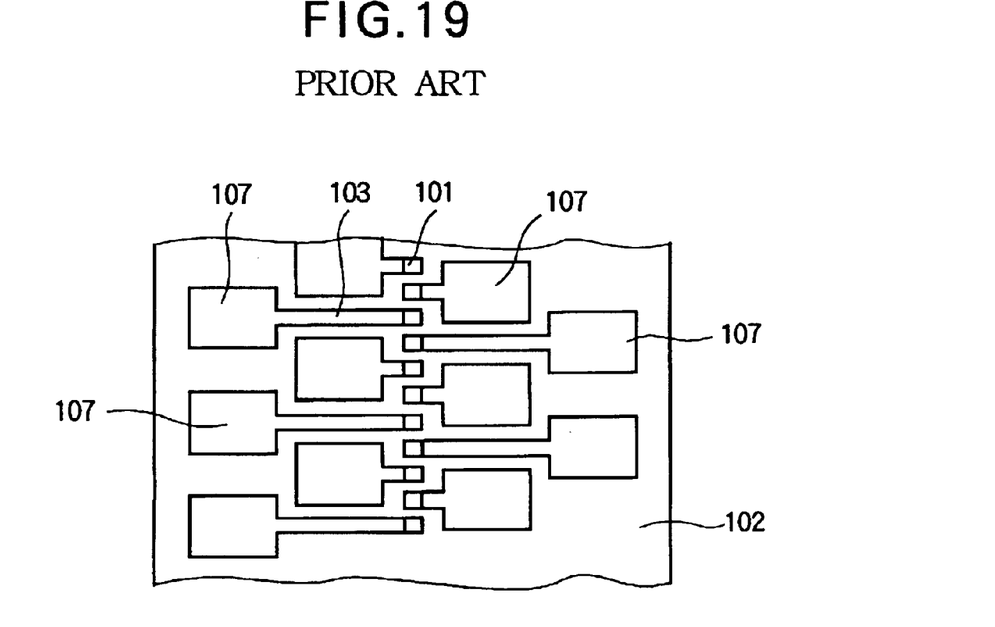
FIG. 19 is a plan view illustrating a conventional LED array.

Linear arrays of light-emitting diodes (LEDs) are used as light sources in, for example, electrophotographic printers. FIG. 18 shows the cross-sectional structure of one such array; FIG. 19 shows a plan view of the array. These drawings are taken from page 60 of *LED Purinta no Sekkei* (Design of LED printers), published by Torikeppusu. In the illustrated LED array 100, a p-type impurity such as zinc has been selectively diffused into an n-type gallium-arsenide-phosphide (GaAsP) semiconductor layer 101 through windows in a dielectric film 102, aluminum p-electrodes 103 have been formed on the dielectric film 102, and a common gold-germanium-nickel (Au—Ge—Ni) n-electrode 104 has been formed on the underside of an n-type gallium-arsenide (GaAs) substrate 105 to create an array of LEDs 106. Each p-electrode 103 couples an LED 106 to a p-electrode pad 107 having sufficient area for wire bonding. The LED 106 emits light when a forward voltage is applied between this p-electrode pad 107 and the common n-electrode 104. The LEDs can thus be individually driven to create a pattern of dots on a photosensitive drum in a printer.

One problem faced by this type of LED array is that if the array density is increased to improve the printing resolution, the p-electrode pads 107 must be must be made smaller and packed more closely together, or staggered in double rows as illustrated in FIG. 19. As a result, wire bonding becomes more difficult, the yield of the manufacturing process is lowered, and the cost per array rises.

Other problems arise because current must be driven through the substrate 105, even though no light is emitted from the substrate. Attempting to solve these problems by replacing the common n-electrode 107 on the underside of the array with one or more n-electrode pads on the upper surface of the array would only aggravate the wire-bonding problem.

SUMMARY OF THE INVENTION

An object of the present invention is to provide an array of semiconductor elements that can be efficiently driven and easily wire-bonded.

The invention provides a semiconductor device having a substantially linear array of semiconductor blocks of a first conductive type. Each semiconductor block includes a diffusion region of a second conductive type, and has a first electrode, separated from the diffusion region, making electrical contact with the semiconductor material of the first conductive type. The provision of a first electrode in each semiconductor block reduces differences in electrical characteristics between different semiconductor blocks.

The semiconductor device also has a plurality of first electrode pads, each having a pair of electrode leads. The leads connect the electrode pad to two semiconductor blocks: one lead makes electrical contact with the diffusion region in one of the two semiconductor blocks; the other electrode lead makes electrical contact with the first electrode in the other one of the two semiconductor blocks. When placed at one potential, the electrode pad activates the one of the semiconductor blocks; when placed at another potential, the same electrode pad activates the other one of the semiconductor blocks. Each semiconductor block is electrically coupled to just one of the first electrode pads. Time-division driving of the semiconductor blocks is simplified because each first electrode pad drives two semiconductor blocks.

The remaining diffusion regions and first electrodes in the semiconductor blocks may be coupled in a similar fashion to a plurality of second electrode pads. In an alternative scheme, the semiconductor device has a single second electrode pad coupled to the remaining diffusion regions, and a third electrode pad coupled to the remaining first electrodes. In another alternative scheme, the semiconductor device has a single second electrode pad coupled to all of the remaining diffusion regions and first electrodes. The alternative schemes enable the semiconductor device to be driven efficiently by a comparatively small number of electrode pads.

The semiconductor blocks are preferably oriented so that the first electrode is separated from the diffusion region in a direction orthogonal to a longitudinal direction of the array, as this orientation enables the array pitch to be reduced.

The semiconductor blocks are preferably isolated from one another by trenches, or by an isolation diffusion region of the second conductive type. The resulting electrical isolation has the desirable effect of confining driving current to the semiconductor blocks. If an isolation diffusion region is used, it can be formed at the same time as the diffusion regions in the semiconductor blocks, simplifying the fabrication process.

The width of the first electrode pads is preferably less than twice the array pitch, so that the first electrode pads can be arranged in a single row to simplify wire bonding.

The semiconductor blocks may emit light when activated.

BRIEF DESCRIPTION OF THE DRAWINGS

In the attached drawings:

FIGS. 2A to 8A are plan views illustrating steps in a fabrication process for the first embodiment;

FIGS. 2B to 8B are sectional views through line 201 in FIGS. 2A to 8A, respectively, seen from direction B;

DETAILED DESCRIPTION OF THE INVENTION

Embodiments of the invention will now be described with reference to the attached drawings, in which like elements are indicated by like reference characters.

First Embodiment

Figure 1A:
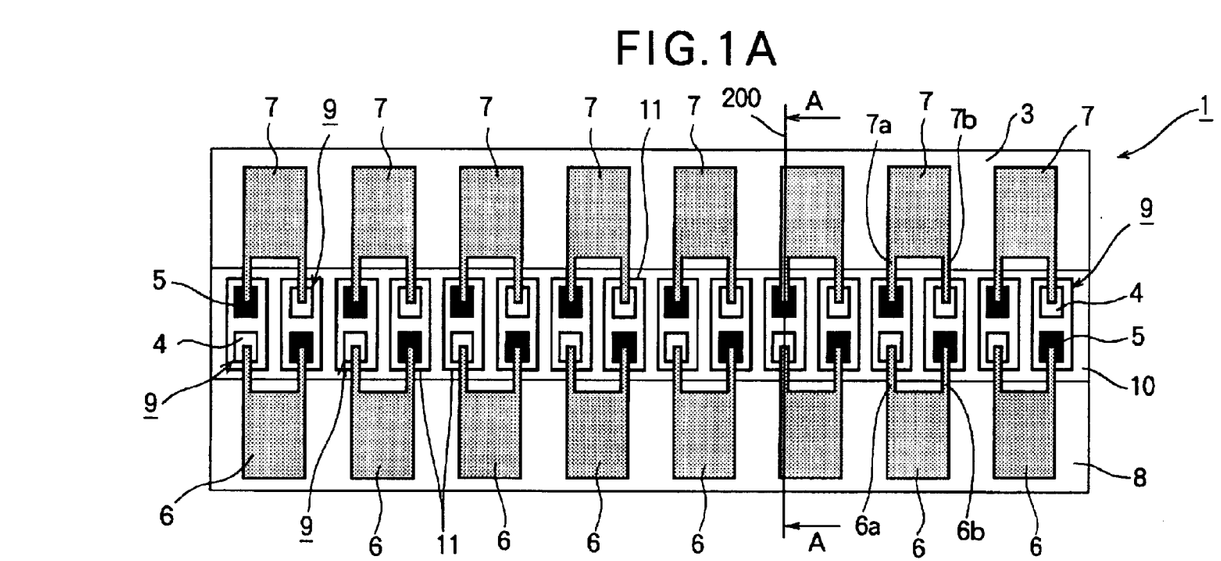
FIG. 1A is a plan view of an LED array according to a first embodiment of the invention.
Figure 1B:
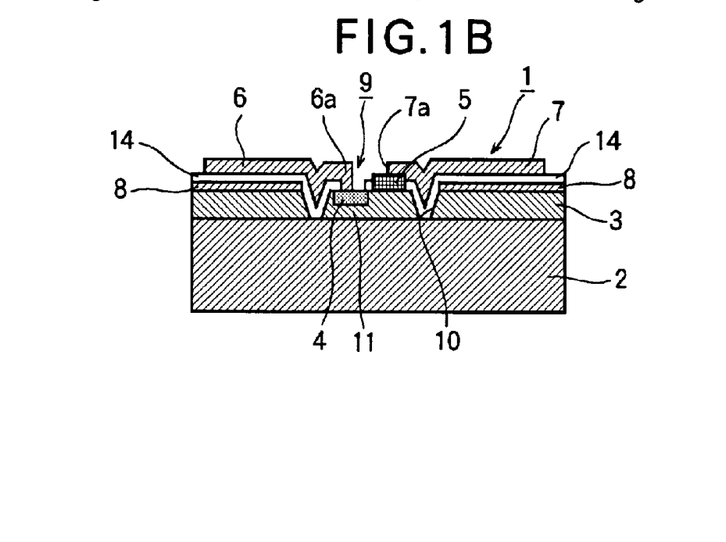
FIG. 1B is a sectional view through line 200 in FIG. 1A, seen from direction A.

Referring to FIGS. 1A and 1B, an LED array 1 according to a first embodiment of the invention comprises a high-resistance substrate 2 such as a semi-insulating GaAs substrate on which is formed a first-conductive-type or n-type semiconductor layer 3. The n-type semiconductor layer 3 is, for example, an aluminum-gallium-arsenide (AlGaAs) layer.

A plurality of diffusion regions 4 are formed in and a like plurality of n-electrodes 5 are formed on the n-type semiconductor layer 3, arranged alternately in a double row so that the diffusion regions 4 are disposed in a staggered linear array. The diffusion regions 4 are p-type regions that have been doped with an electron acceptor impurity such as zinc. The n-electrodes 5 comprise a material such as a gold alloy that makes ohmic contact with the n-type semiconductor layer 3.

A plurality of conductive patterns comprising respective electrode pads 6 with electrode leads 6a, 6b are disposed on one side of the array (the lower side in FIG. 1A, the left side in FIG. 1B). Each electrode pad 6 is electrically coupled by its electrode leads 6a, 6b to one diffusion region 4 and one adjacent n-electrode 5. A similar plurality of electrode pads 7 are disposed on the other side of the array, each electrically coupled by a pair of electrode leads 7a, 7b to one n-electrode 5 and one diffusion region 4. The electrode leads 6a, 6b, 7a, 7b are insulated from the surface of the n-type semiconductor layer 3 by a first interlayer dielectric film 8. Electrode leads 6a and 7b make ohmic contact with the diffusion regions 4.

Each diffusion region 4 is paired with a facing n-electrode 5 to create a light-emitting diode 9. Each light-emitting diode 9 is surrounded by a trench 10 that cuts through the n-type semiconductor layer 3 down to the high-resistance substrate 2. The light-emitting diode 9 is thus disposed in an island-shaped semiconductor block 11 formed from part of the material of the n-type semiconductor layer 3. Where the electrode leads 6a, 6b, 7a, 7b cross the trench cuts, a second interlayer dielectric film 14 insulates the electrode leads 6a, 6b, 7a, 7b from the exposed sides of the n-type semiconductor layer 3, including the sides of the semiconductor blocks 11. The second interlayer dielectric film 14 also provides extra insulation on the upper surface of the n-type semiconductor layer 3.

As shown in FIG. 1A, the semiconductor blocks 11 are paired side by side, the two semiconductor blocks 11 in each pair being coupled to the same electrode pad 6 below the array and the same electrode pad 7 above the array. In one of the two semiconductor blocks 11, diffusion region 4 is coupled to electrode pad 6 and n-electrode 5 to electrode pad 7. In the other semiconductor block 11, these connections are reversed: n-electrode 5 is coupled to electrode pad 6, and diffusion region 4 to electrode pad 7.

An exemplary fabrication process for this LED array 1 will now be described.

Figure 2A:
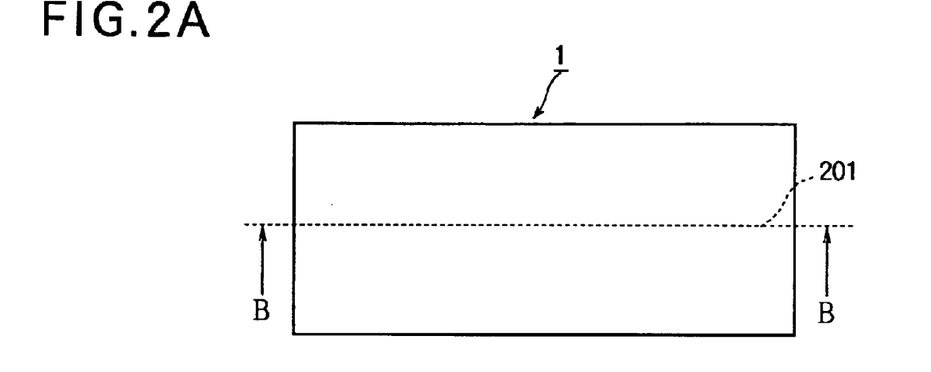
Figure 2B:
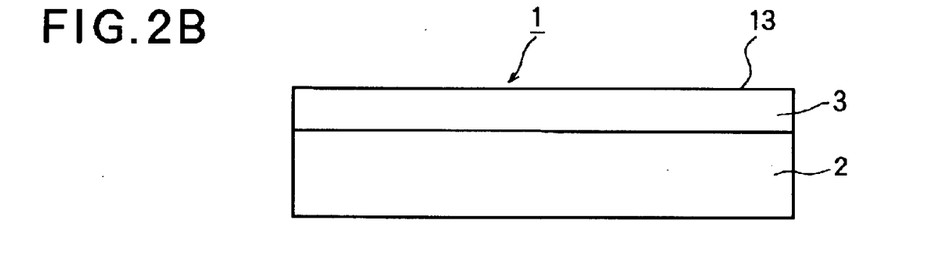

Referring to FIGS. 2A and 2B, the first fabrication step is an epitaxial growth step that forms the n-type semiconductor layer 3 on the high-resistance substrate 2. If the n-type semiconductor layer is an n-type AlGaAs layer, a GaAs contact cap layer 13 is grown on the n-type semiconductor layer 3 to provide better ohmic contact with the electrode leads that will be formed later.

Figure 3A:
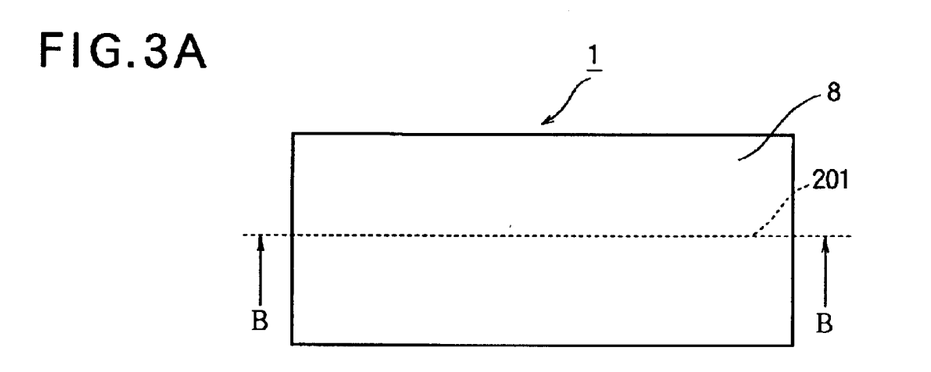
Figure 3B:
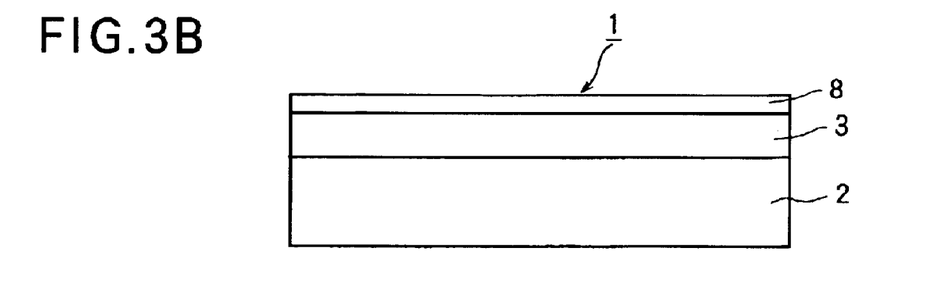

Referring to FIGS. 3A and 3B, the first interlayer dielectric film 8 is now deposited. The first interlayer dielectric film 8 is, for example, an aluminum oxide ($Al_2O_3$) film five hundred to three thousand angstroms (500 Å to 3000 Å) thick. The first interlayer dielectric film 8 may be deposited by sputtering.

Figure 4A:
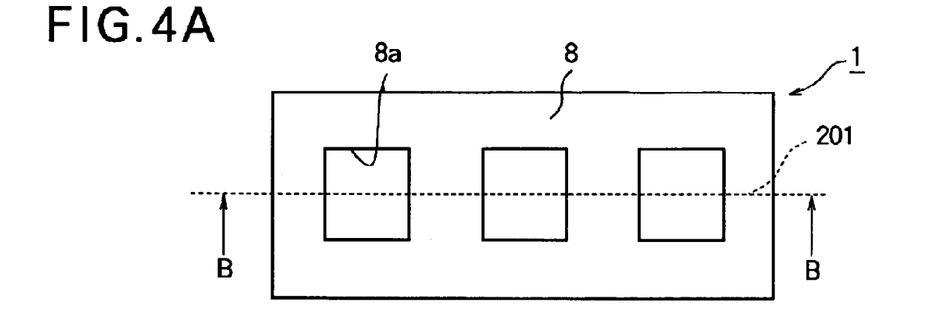
Figure 4B:
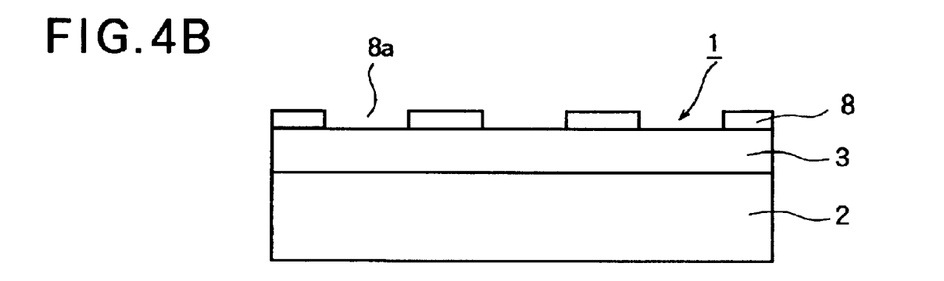

Referring to FIGS. 4A and 4B, windows 8a are formed in the first interlayer dielectric film 8 to create a diffusion mask. The windows 8a may be formed by photolithography and etching. For simplicity, the windows 8a are shown as being formed in a single straight row, but they are actually formed in a staggered pattern, as will become apparent later.

Figure 5A:
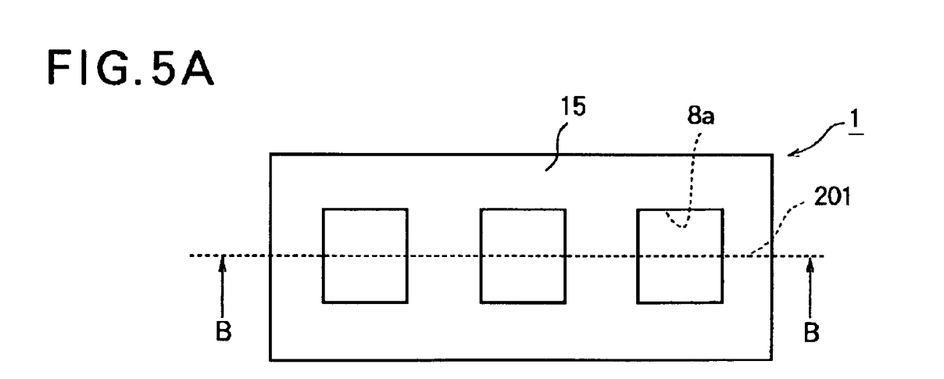
Figure 5B:
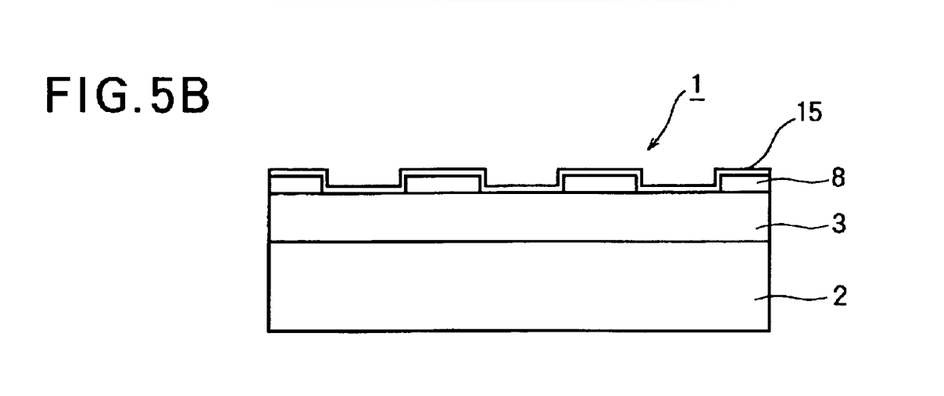

Referring to FIGS. 5A and 5B, a zinc-doped dielectric film 15 such as a zinc oxide (ZnO) film 500 Å to 3000 Å thick is deposited as a diffusion source. This dielectric film 15 may be deposited by sputtering.

Figure 6A:
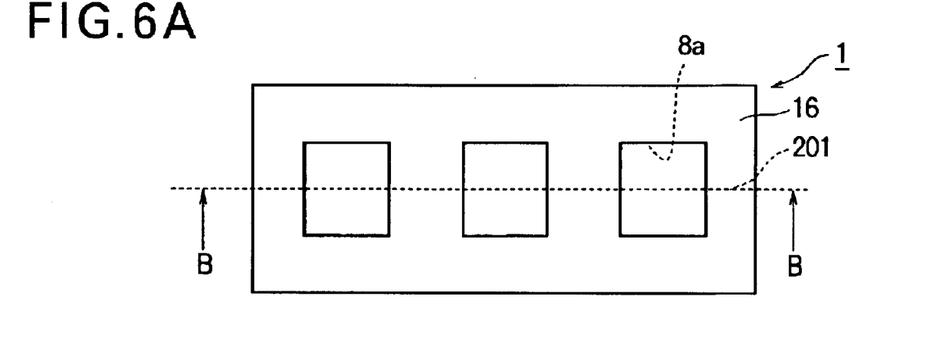
Figure 6B:
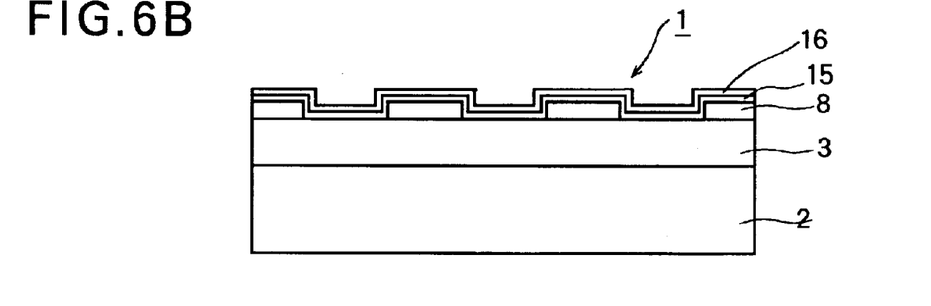

Referring to FIGS. 6A and 6B, an anneal cap film 16 such as a silicon nitride (SiN) film 500 Å to 3000 Å thick is deposited on the dielectric film 15. The anneal cap film 16 may be deposited by chemical vapor deposition (CVD).

Figure 7A:
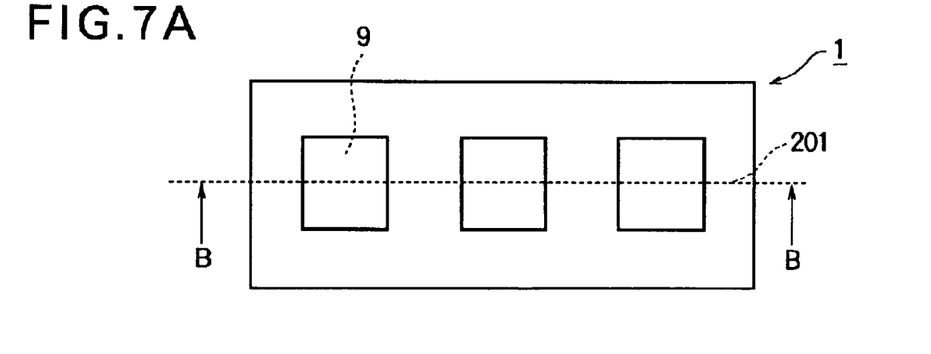
Figure 7B:
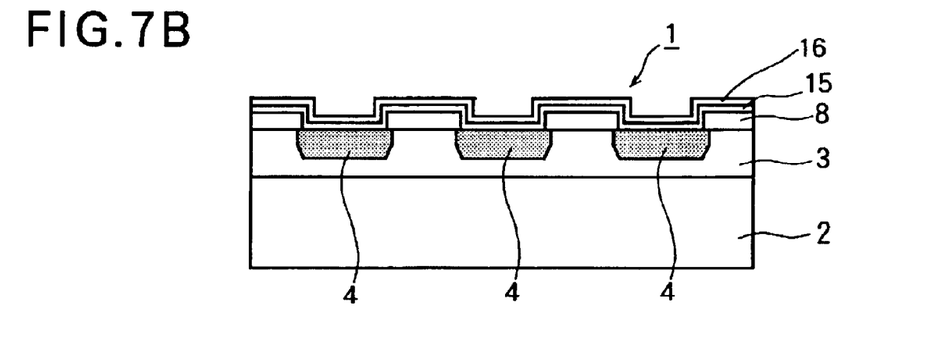

Referring to FIGS. 7A and 7B, the device is annealed for about one hour at 650° C. in a nitrogen atmosphere, causing zinc to diffuse from the dielectric film 15 into the n-type semiconductor layer 3 and form p-type diffusion regions 4.

Figure 8A:
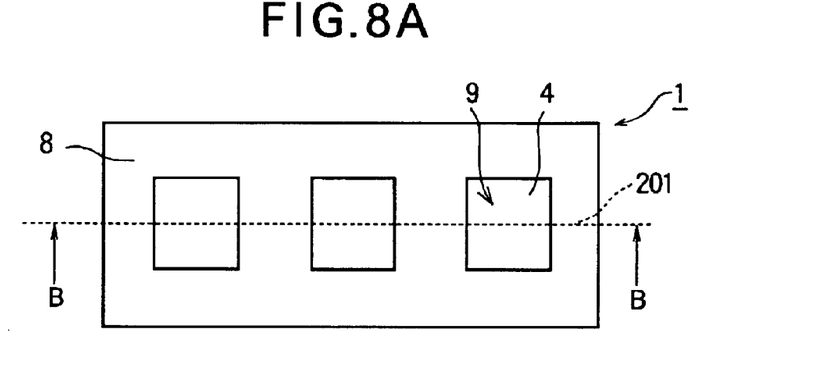
Figure 8B:
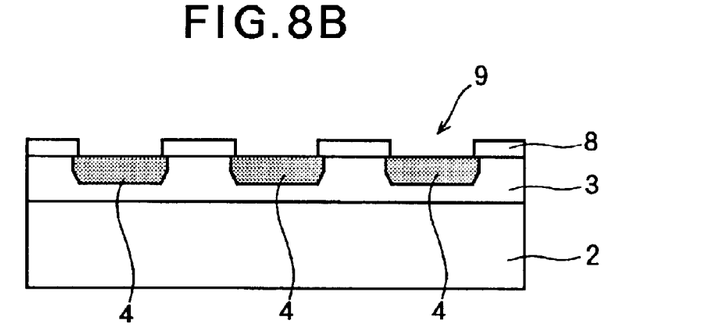

Referring to FIGS. 8A and 8B, the anneal cap film 16 and dielectric film 15 are now removed, exposing the surfaces of the diffusion regions 4.

Figure 9:
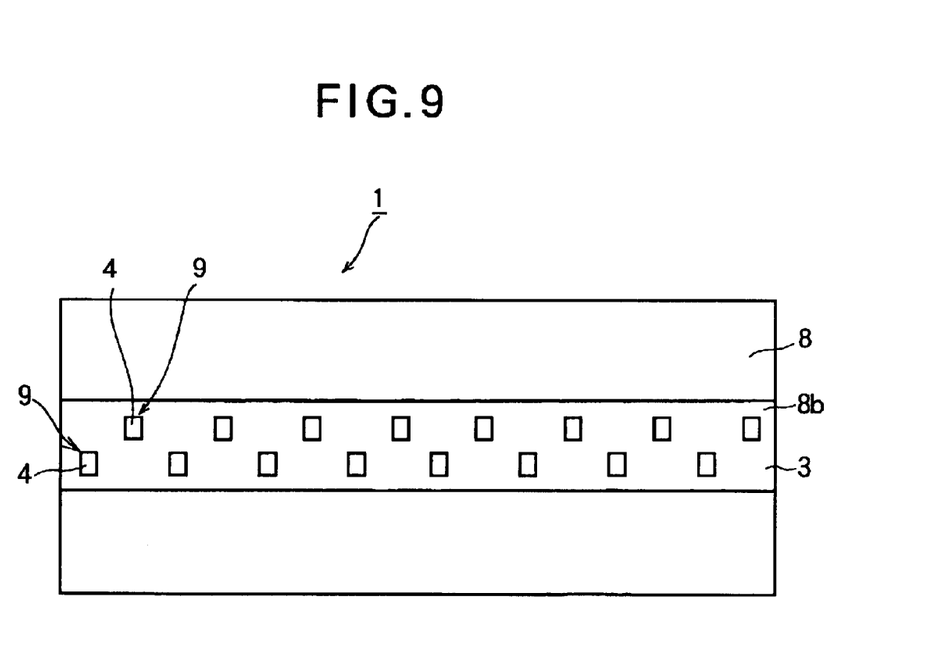
FIGS. 9 to 13 are plan views illustrating further steps in the fabrication process for the first embodiment.

Referring to FIG. 9, more of the first interlayer dielectric film 8 is removed by photolithography and etching to form a strip-shaped window 8b that exposes the surface of the n-type semiconductor layer 3. The exposed strip includes the parts of the n-type semiconductor layer 3 that will become the light-emitting diodes 9. FIG. 9 shows the actual staggered arrangement of the diffusion regions 4.

Figure 10:
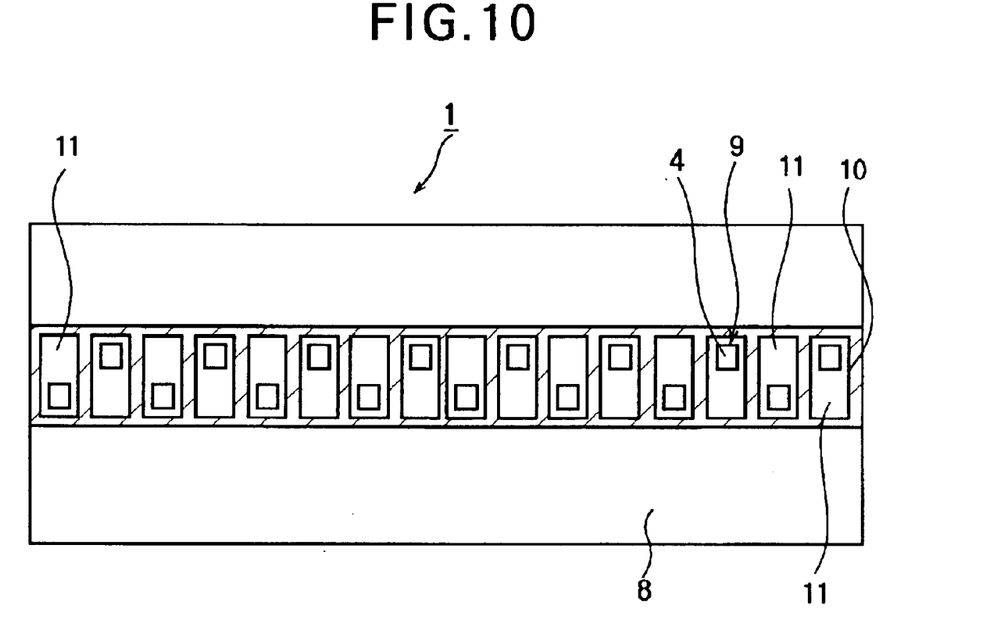

Referring to FIG. 10, the exposed part of the n-type semiconductor layer 3 is patterned by photolithography and etching to form the semiconductor blocks 11, each surrounded by a trench 10. The trenches join to form a single connected trench pattern. The trench 10 extends to the high-resistance substrate 2 (as shown in FIG. 1B), so the semiconductor blocks 11 are substantially isolated from one another and form substantially independent light-emitting diodes 9.

Figure 11:
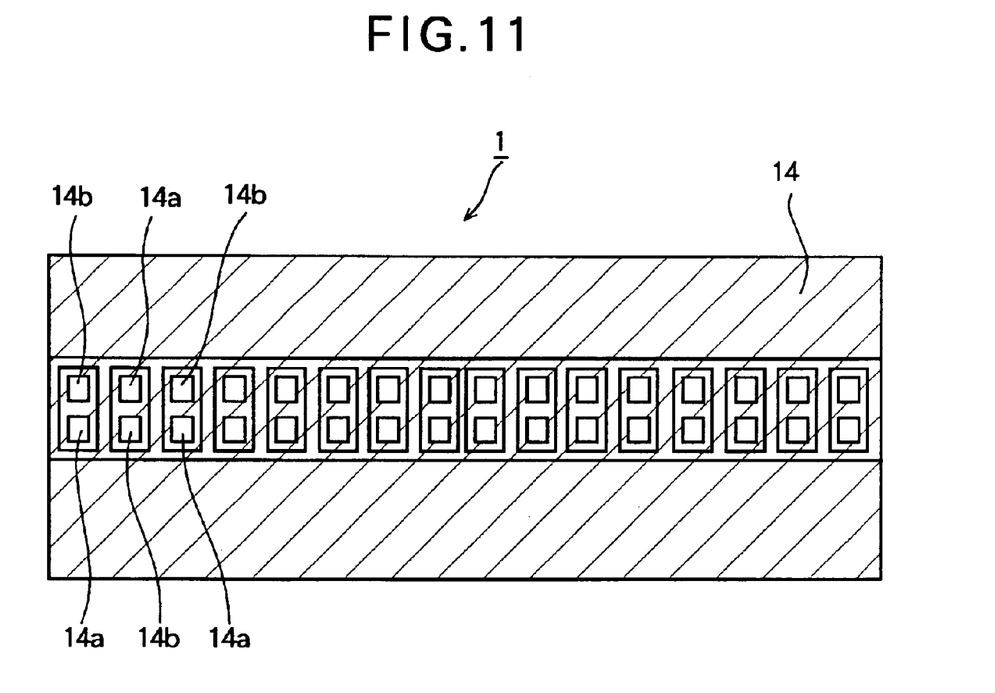

Referring to FIG. 11, the second interlayer dielectric film 14 is formed over the entire surface of the LED array 1, except for windows 14a above the diffusion regions and windows 14b in which the n-electrodes will be formed. The second interlayer dielectric film 14 may be a silicon nitride film 500 Å to 3000 Å thick, which is first deposited on the entire surface of the device and then removed from the window regions 14a, 14b by photolithography and etching.

Figure 12:
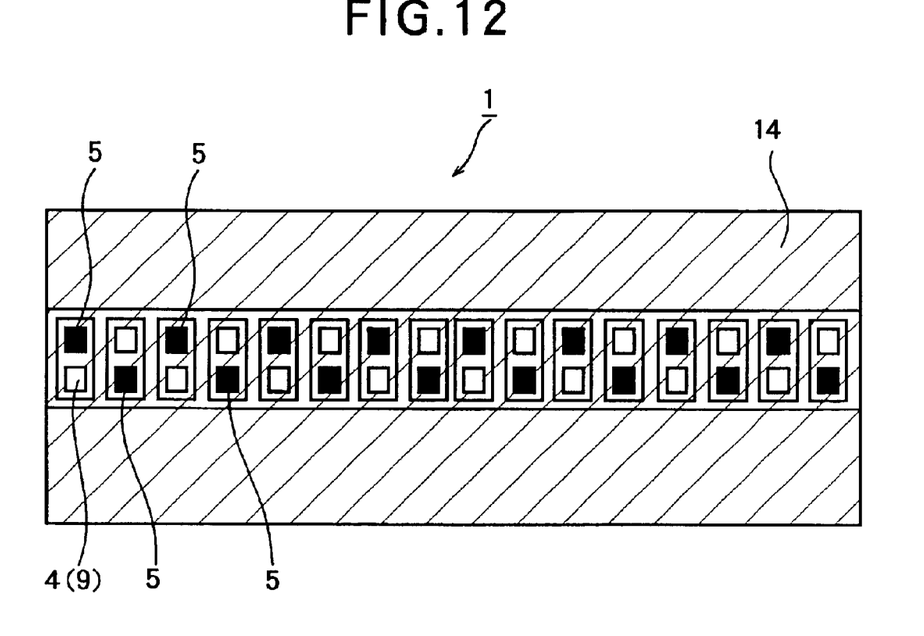

Referring to FIG. 12, the n-electrodes 5 are now formed in the appropriate window regions 14b. The n-electrodes 5 may be formed by evaporation deposition of a gold alloy film, followed by removal of the deposited film from unwanted regions by lift-off, then by sintering (heat treatment) of the remaining electrode material.

Figure 13:
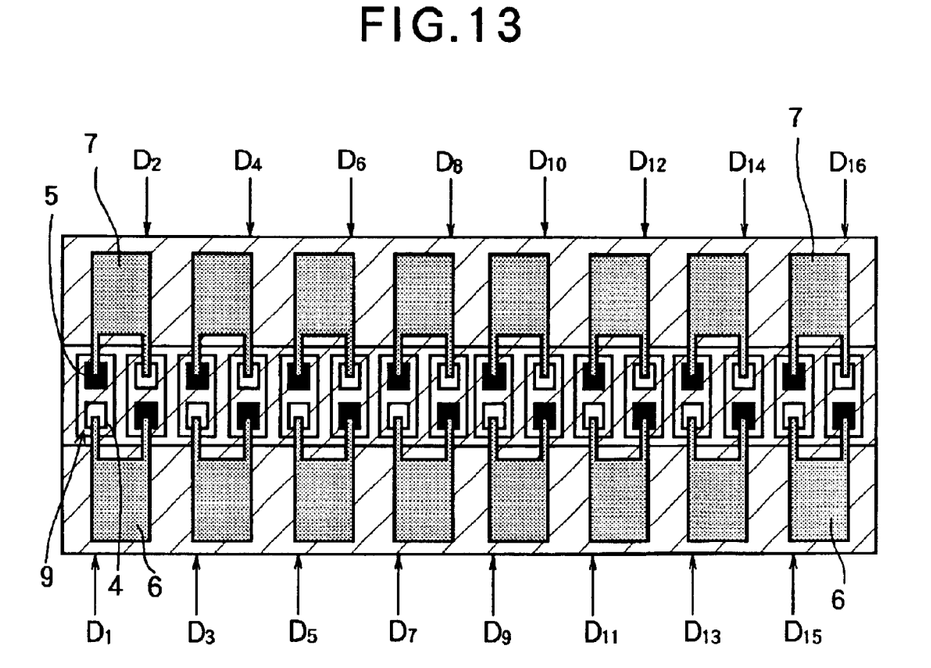

Referring to FIG. 13, the electrode pads 6 and 7 and their electrode leads are formed by a similar process of deposition, lift-off, and sintering. The electrode pads and leads may be formed from a multilayer gold film. The LED array is now complete.

A method of driving the LED array 1 will be described with reference to FIG. 13. For purposes of explanation, the light-emitting diodes 9 in FIG. 13 are denoted $D_1$, $D_2$, $D_3$, $D_4$, . . . in sequence from the left end of the array.

To drive the odd-numbered light-emitting diodes $D_1$, $D_3$, . . . , voltages are supplied to the electrode pads so that the lower electrode pads 6 are positive with respect to the upper electrode pads 7. The odd-numbered light-emitting diodes $D_1$, $D_3$, . . . are thus forward-biased and emit light. The even-numbered light-emitting diodes $D_2$, $D_4$, . . . are reverse-biased and do not emit light. If it is not necessary to drive all of the odd-numbered light-emitting diodes $D_1$, $D_3$, . . . , some of the lower electrode pads 6 can be left at the same potential as the upper electrode pads 7; the light-emitting diodes connected to these electrode pads 6 are unbiased and do not emit light.

Next, to drive the even-numbered light-emitting diodes $D_2$, $D_4$, . . . , the bias of the electrode pads is reversed so that the lower electrode pads 6 are negative with respect to the upper electrode pads 7. The even-numbered light-emitting diodes $D_2$, $D_4$, . . . are now forward-biased and emit light, while the odd-numbered light-emitting diodes $D_1$, $D_3$, . . . are reverse-biased and do not emit light. If it is not necessary to drive all of the even-numbered light-emitting diodes $D_2$, $D_4$, . . . , some of the lower electrode pads 6 can be left at the same potential as the upper electrode pads 7.

In an electrophotographic printer, if the time interval between the driving of the odd-numbered light-emitting diodes and the driving of the even-numbered light-emitting diodes is properly selected, the dots formed by the even-numbered light-emitting diodes will align with the dots formed by the odd-numbered light-emitting diodes on the printer's rotating photosensitive drum, so that a straight row of dots is formed. The alternate driving of odd-numbered and even-numbered light-emitting diodes is thus not a disadvantage. Rather, alternate driving is an advantage because it avoids the high current drain that would occur if all light-emitting diodes were to be driven simultaneously.

Another advantage of the first embodiment is the comparatively short current path through each light-emitting diode, from the electrode lead on one side to the electrode lead on the other side. All of the current paths have the same length, and current flow is substantially confined to the light-emitting diodes by the high-resistance substrate. These factors contribute to efficient driving and uniform light emission.

Moreover, even though each light-emitting diode has its own n-electrode, the total number of wire-bonding electrode pads is no greater than in the conventional LED array shown in FIG. 19, because each electrode pad serves two light-emitting diodes. The above advantages are thus obtained without creating additional wire-bonding difficulties.

Second Embodiment

Figure 14A:
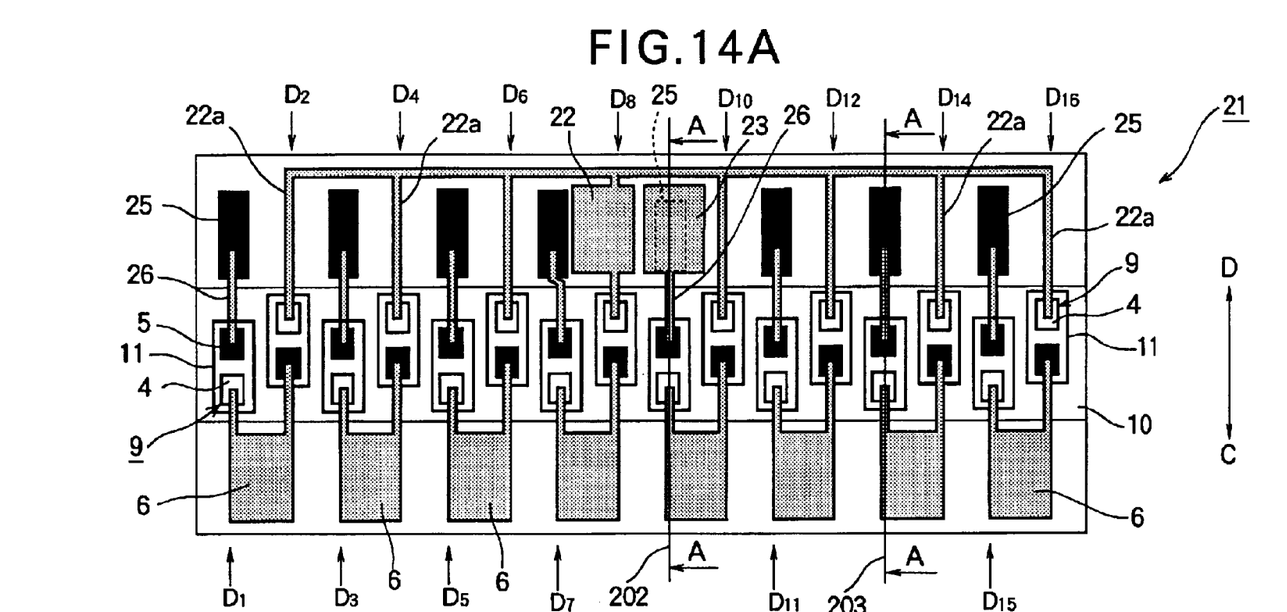
FIG. 14A is a plan view of an LED array according to a second embodiment of the invention.
Figure 14B:
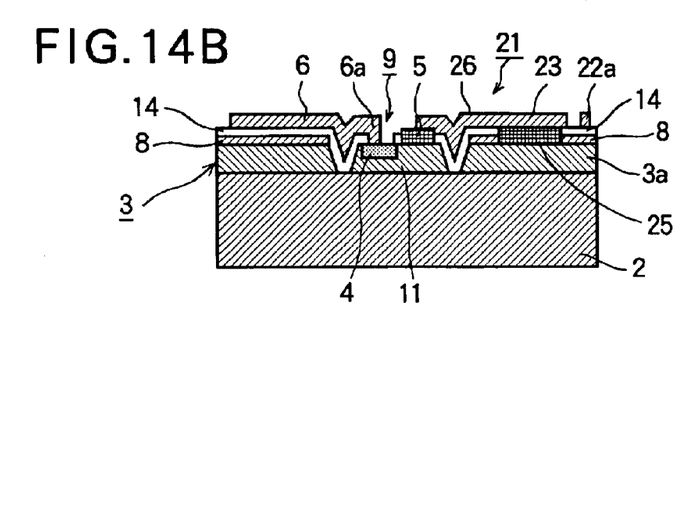
FIG. 14B is a sectional view through line 202 in FIG. 14A, seen from direction A.
Figure 14C:
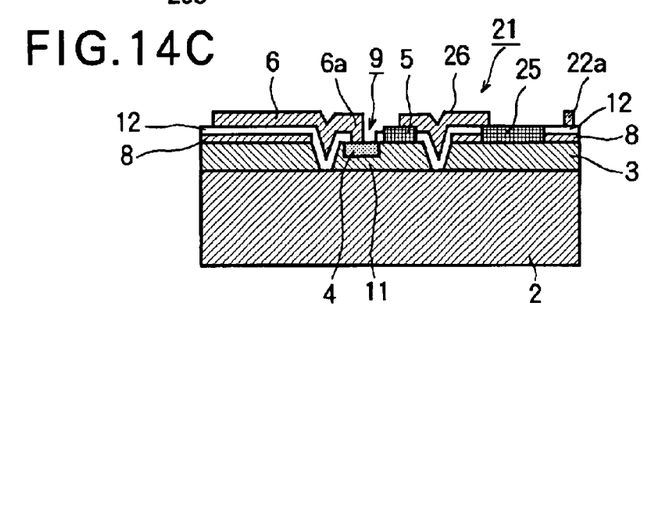
FIG. 14C is a sectional view through line 203 in FIG. 14A, seen from direction A.

Referring to FIGS. 14A, 14B, and 14C, the LED array 21 of the second embodiment differs from the LED array of the first embodiment in that the semiconductor blocks 11 are arranged in a zigzag pattern, being shifted alternately in the directions of arrows C (down) and D (up), these directions being orthogonal to the longitudinal direction of the array. Another difference is that there are only two upper electrode pads: a common p-electrode pad 22 and a common n-electrode pad 23. The common p-electrode pad 22 is electrically coupled by p-electrode leads 22a to the p-type diffusion regions 4 of the light-emitting diodes 9 disposed in the semiconductor blocks 11 shifted in the direction of arrow D.

Additional n-electrodes 25 are formed on the n-type semiconductor layer 3 in the isolated region 3a above the trench pattern 10. These n-electrodes 25, which make ohmic contact with the n-type semiconductor layer 3, are electrically coupled by n-electrode leads 26 to the n-electrodes 5 in the semiconductor blocks 11 shifted in the direction of arrow C. One of these additional n-electrodes 25 is overlain by and makes electrical contact with the common n-electrode pad 23.

Accordingly, the n-electrodes 5 in all of the semiconductor blocks 11 shifted in the direction of arrow C are electrically coupled to the common n-electrode pad 23 through the n-electrode leads 26, the additional n-electrodes 25, and the body of the isolated region 3a of the n-type semiconductor layer 3. For good electrical continuity, the n-type semiconductor layer 3 is preferably doped with a semiconductor impurity element such as sulfur (S), selenium (Se), tellurium (Te), germanium (Ge), or silicon (Si) at a carrier concentration of $10^{-15}/cm^3$ to $10^{-19}/cm^3$.

The LED array 21 of the second embodiment can be fabricated by the process described in the first embodiment, the additional n-electrodes 25 being formed in the same step as the n-electrodes 5 in the semiconductor blocks 11, and the n-electrode leads 26 in the same step as the electrode pads 6, 22, 23.

A method of driving the LED array 1 will be described with reference to FIG. 14A. For purposes of explanation, the light-emitting diodes 9 in FIG. 13 are denoted $D_1$, $D_2$, $D_3$, $D_4$, . . . in sequence from the left end of the array.

To drive the odd-numbered light-emitting diodes $D_1$, $D_3$, . . . , voltages are supplied to the electrode pads so that the lower electrode pads 6 are positive with respect to the common electrode pads 22, 23. The odd-numbered light-emitting diodes $D_1$, $D_3$, . . . are forward-biased and emit light. The even-numbered light-emitting diodes $D_2$, $D_4$, . . . are reverse-biased and do not emit light. Alternatively, the common p-electrode pad 22 may be left electrically open (floating), so that the even-numbered light-emitting diodes $D_2$, $D_4$, . . . are unbiased. If it is not necessary to drive all of the odd-numbered light-emitting diodes $D_1$, $D_3$, . . . , some of the lower electrode pads 6 can be left at the same potential as the common n-electrode pad 23, or left open.

Next, to drive the even-numbered light-emitting diodes $D_2$, $D_4$, . . . , the bias of the electrode pads is reversed so that the lower electrode pads 6 are negative with respect to the common electrode pads 22, 23. The even-numbered light-emitting diodes $D_2$, $D_4$, . . . are now forward-biased and emit light, while the odd-numbered light-emitting diodes $D_1$, $D_3$, . . . are reverse-biased and do not emit light. Alternatively, the common n-electrode pad 23 may be left electrically open so that the odd-numbered light-emitting diodes $D_1$, $D_3$, . . . are unbiased. If it is not necessary to drive all of the even-numbered light-emitting diodes $D_2$, $D_4$, . . . , some of the lower electrode pads 6 can be left at the same potential as the common p-electrode pad 22, or left open.

When the LED array 21 is used as a light source in an electrophotographic printer, the time interval between the driving of the odd-numbered and even-numbered light-emitting diodes can be adjusted so that the dots created by the emitted light align in a single row on the rotating photosensitive drum.

Substantially the same effects are obtained from the second embodiment as from the first embodiment, but with a much smaller total number of electrode pads. The wire bonding process is accordingly simplified, and both the manufacturability and the reliability of the LED array are enhanced.

Third Embodiment

Figure 15A:
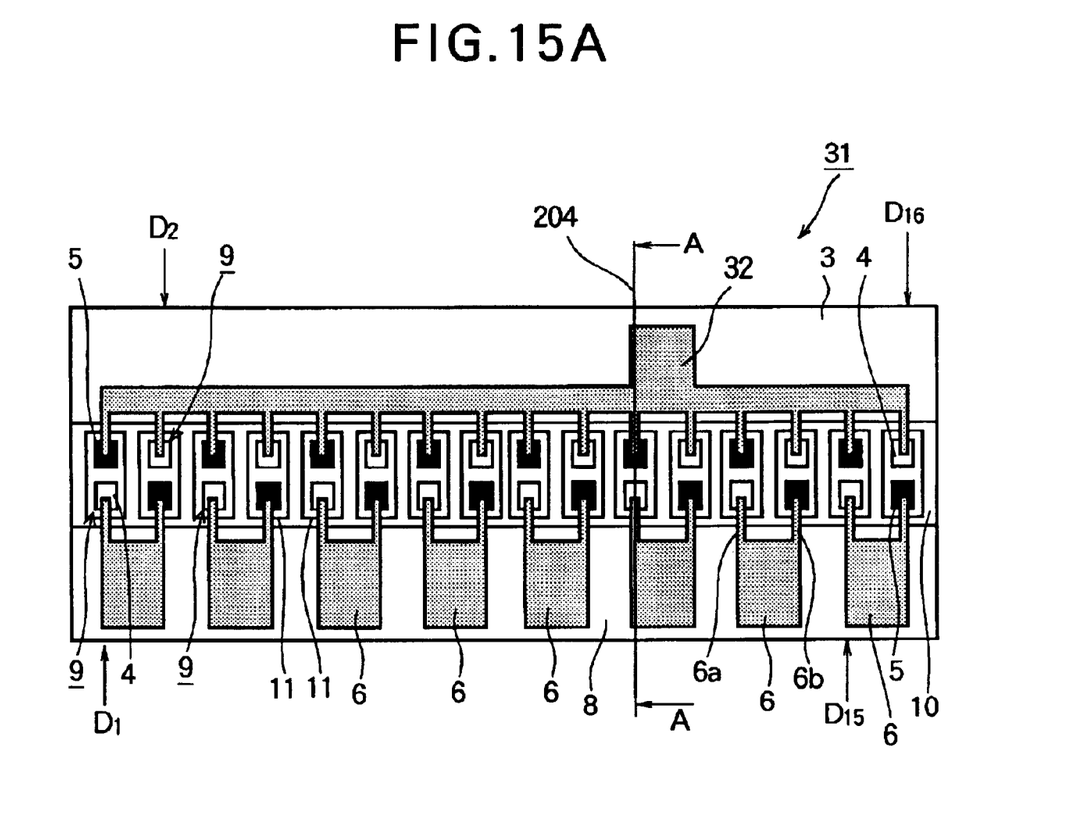
FIG. 15A is a plan view of an LED array according to a third embodiment of the invention.
Figure 15B:
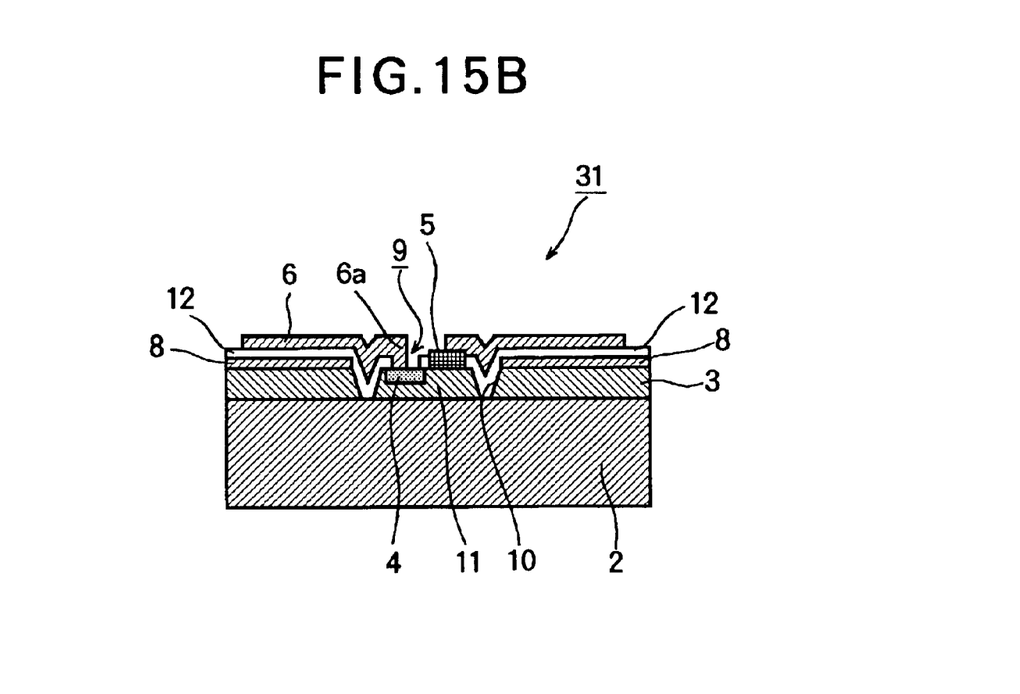
FIG. 15B is a sectional view through line 204 in FIG. 15A, seen from direction A.

Referring to FIGS. 15A and 15B, the LED array 31 in the third embodiment replaces the upper electrode pads of the first embodiment with a single common electrode 32 to which all of the light-emitting diodes 9 are electrically coupled. The common electrode 32 is a unitary structure including a wire bonding pad area, a linear extension paralleling the array of semiconductor blocks 11, and leads making electrical contact with the n-electrodes 5 in the odd-numbered light-emitting diodes $D_1, \ldots, D_{15}$, and with the diffusion regions 4 in the even-numbered light-emitting diodes $D_2, \ldots, D_{16}$.

To drive the odd-numbered light-emitting diodes $D_1, \ldots, D_{15}$, voltages are supplied that make the electrode pads 6 positive with respect to the common electrode 32. To drive the even-numbered light-emitting diodes $D_2, \ldots, D_{16}$, voltages are supplied that make the electrode pads 6 negative with respect to the common electrode 32. When it is not necessary to drive all of the odd- or even-numbered light-emitting diodes, some of the electrode pads 6 left at the same potential as the common electrode 32, or can be left open.

As in the preceding embodiments, when the LED array 31 is used as a light source in an electrophotographic printer, the time interval between the driving of the odd-numbered and even-numbered light-emitting diodes can be adjusted so that the dots created thereby align in a single row on the rotating photosensitive drum.

Substantially the same effects are obtained from the third embodiment as from the second embodiment, but with a further reduction in the total number of electrode pads.

Fourth Embodiment

Figure 16A:
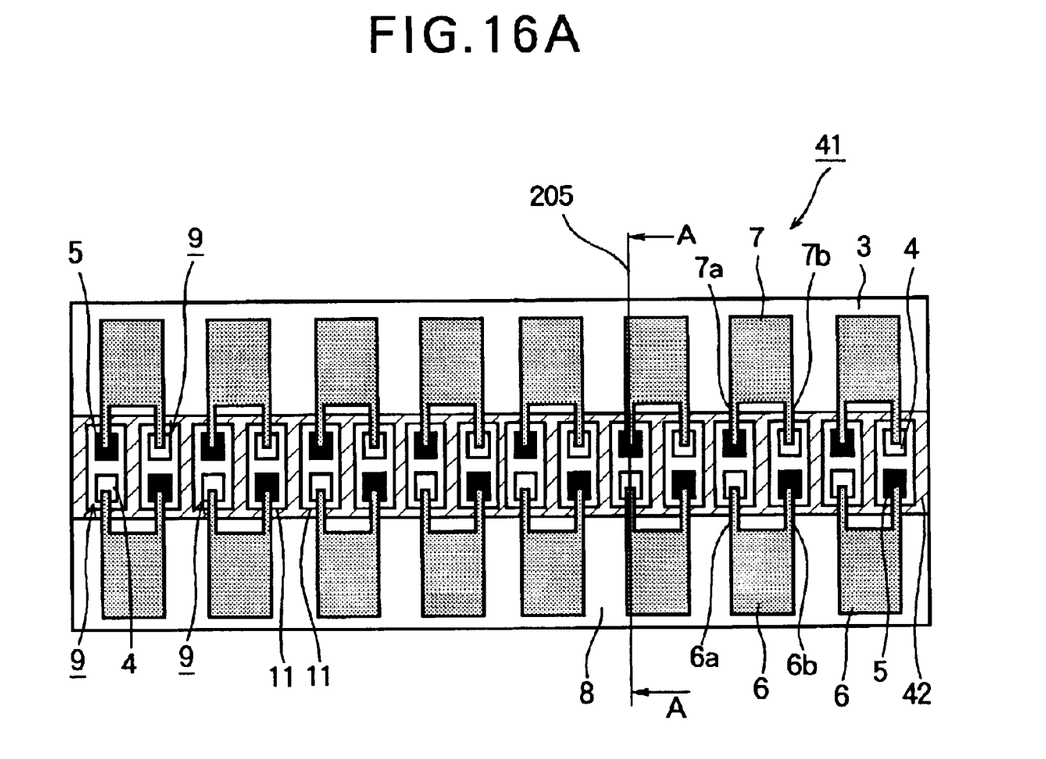
FIG. 16A is a plan view of an LED array according to a fourth embodiment of the invention.
Figure 16B:
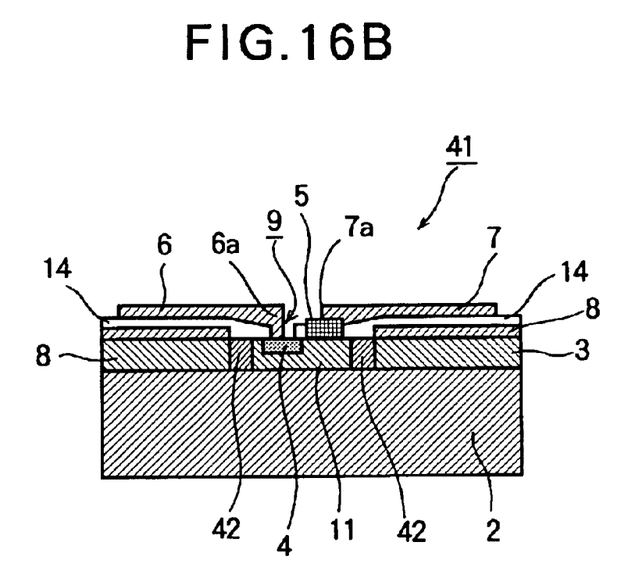
FIG. 16B is a sectional view through line 205 in FIG. 16A, seen from direction A.

Referring to FIGS. 16A and 16B, the LED array 41 in the fourth embodiment differs from the LED array in the first embodiment in that the semiconductor blocks 11 are surrounded by an isolation diffusion region 42 instead of by a trench. The isolation diffusion region 42 extends down to the high-resistance substrate 2.

The isolation diffusion region 42 can be formed by solid-phase diffusion of zinc, either before the diffusion regions 4 of the light-emitting elements 9 are formed, or at the same time.

If the element isolation diffusion region 42 is formed before the diffusion regions 4, a separate diffusion mask (not shown) can be used. Alternatively, the first interlayer dielectric film 8 can be patterned as a diffusion mask twice: the first patterning defines the isolation diffusion region 42; after the isolation diffusion region 42 has been formed by solid-phase diffusion, the anneal cap and diffusion source films are removed and the first interlayer dielectric film 8 is patterned again to create the windows defining the diffusion regions 4; then a new diffusion source and anneal cap are deposited and solid-phase diffusion is repeated to form the diffusion regions 4. The anneal times of the two solid-phase diffusion steps are adjusted so that the isolation diffusion region 42 reaches the high-resistance substrate 2, while the diffusion regions 4 do not. After the second solid-phase diffusion step, the parts of the first interlayer dielectric film 8 remaining on the semiconductor blocks 11 are removed.

If the element isolation diffusion region 42 and diffusion regions 4 in the light-emitting diodes 9 are formed simultaneously, the first interlayer dielectric film 8 is patterned to form diffusion windows for both the element isolation diffusion region 42 and the diffusion regions 4 of the light-emitting diodes 9. Next, a diffusion control film such as a film or phosphosilicate glass (PSG), silicon nitride (SiN), aluminum oxide ($Al_2O_3$), or the like is formed over the windows defining the diffusion regions 4 of the light-emitting diodes 9. After a diffusion source and an anneal cap have been deposited, solid-phase diffusion is carried out under the conditions described in the first embodiment (650° C. in a nitrogen atmosphere, for example) but for a longer time, so that that the isolation diffusion region 42 extends through the n-type semiconductor layer 3 to the high-resistance substrate 2. The diffusion regions 4 formed in the light-emitting diodes are shallower, because of the diffusion control film.

Once the diffusion regions 4 have been formed, the subsequent fabrication steps are carried out as described in the first embodiment. The surface of the isolation diffusion region 42 is covered by the second interlayer dielectric film 14.

The isolation diffusion region 42 electrically isolates the semiconductor blocks 11, producing substantially the same effects as the trenches in the first embodiment, but with enhanced fabrication yields and reliability, because the electrode leads 6a, 6b, 7a, 7b are formed on a more level surface. The number of fabrication steps can also be reduced by forming the element isolation diffusion region 42 and the diffusion regions 4 of the light-emitting elements simultaneously, as explained above.

Fifth Embodiment

Figure 17:
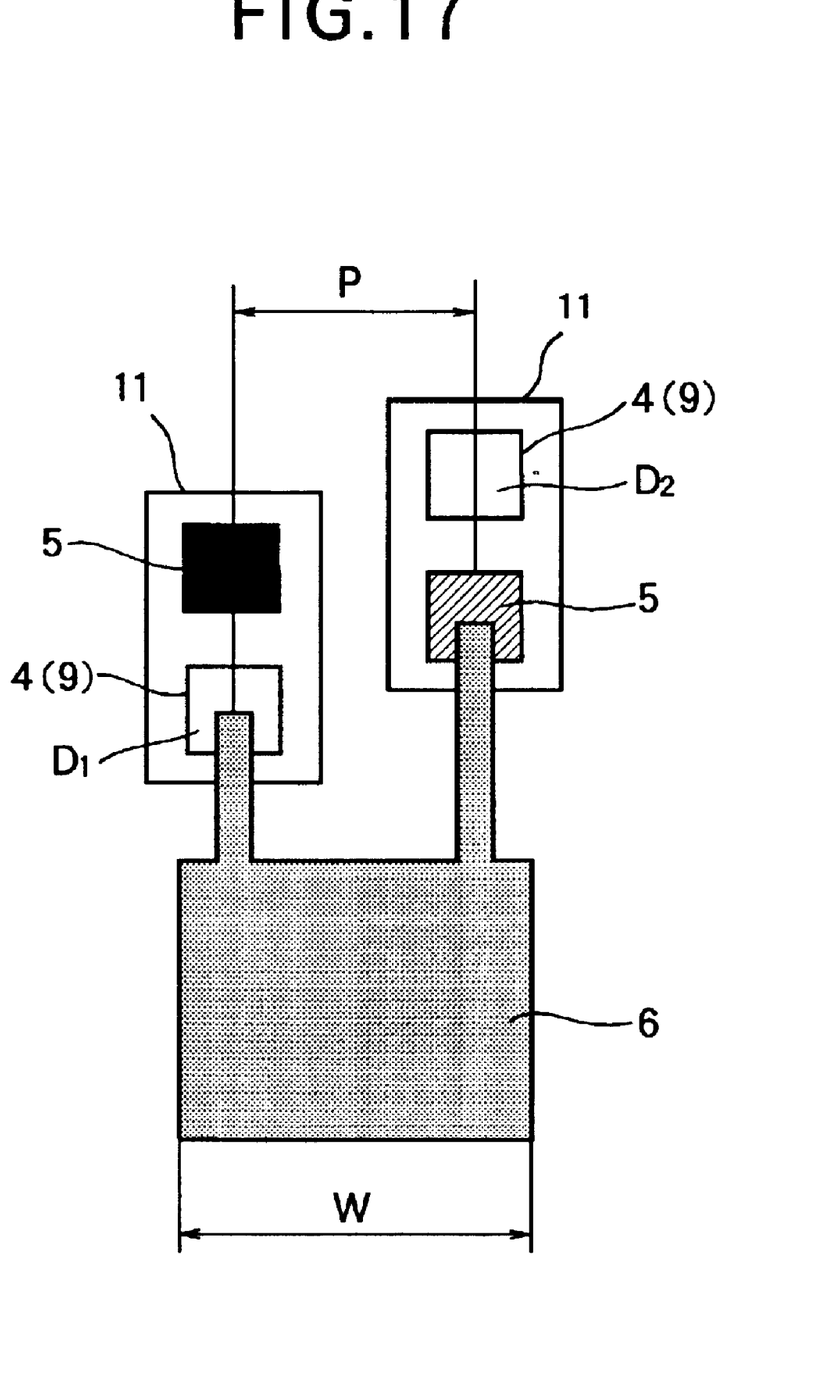
FIG. 17 is a plan view illustrating the geometry of an LED array according to a fifth embodiment of the invention.

The fifth embodiment combines the structure of the second embodiment with a dimensional restriction on the electrode pads 6. Referring to FIG. 17, the restriction is that the width W of the electrode pads 6 must be less than twice the pitch P of the LED array. That is, $$W<2P$$

If this condition is satisfied, the electrode pads 6 can be arranged in a single row with the same length as the row of semiconductor blocks 11, as shown in FIG. 14A. Compared with the conventional LED array shown in FIG. 19, the fifth embodiment enables the overall size of the LED array to be reduced, so that more LED array chips can be fabricated from a single semiconductor wafer. The unit cost of the LED array is thereby reduced.

A similar condition can be placed on the electrode pads 6, 7 in the first embodiment, and the electrode pads 6 in the third and fourth embodiments.

Next, a few variations of the preceding embodiments will be noted.

In one variation, the n-type semiconductor layer 3 is replaced by a p-type semiconductor layer, and the light-emitting diodes are formed by diffusion of an n-type impurity.

In another variation, the diffusion regions 4 are formed by vapor-phase diffusion or ion implantation instead of solid-phase diffusion.

In other variations, the substrate, electrode, and/or impurity materials mentioned above are replaced with other materials producing similar effects. In the fourth embodiment, for example, the isolation diffusion region may be formed by diffusion of carbon instead of zinc. Different diffusion techniques may be used for the isolation diffusion region and the light-emitting diodes: for example, the isolation diffusion region may be formed by vapor-phase diffusion or ion implantation while the diffusion regions in the light-emitting diodes are formed by solid-phase diffusion.

Any combination of processes that enables the isolation diffusion region to be deeper than the diffusion regions in the light-emitting diodes may be used.

The positions and orientations of the light-emitting diodes can be altered in various ways. In the first embodiment, for example, with reference to FIG. 13, the positions of light-emitting diodes $D_3$ and $D_4$ can be interchanged, the positions of light-emitting diodes $D_7$ and $D_8$ can be interchanged, the positions of light-emitting, diodes $D_{11}$ and $D_{12}$ can be interchanged, and so on, so that the diode orientation reverses at intervals of two light-emitting diodes in the array instead of at every light-emitting diode in the array. That is, if 'up' denotes the orientation in which the diffusion region 4 is connected to an electrode pad 7 above the array and 'down' denotes the orientation in which the diffusion region 4 is connected to an electrode pad 6 below the array, the array becomes a 'down-up-up-down-down-up-up-down . . . ' array instead of a 'down-up-down-up-down-up-down-up . . . ' array. Similar alterations can be made in the other embodiments.

The invention is not limited to LED arrays. The inventive concept can also be applied to an array of semiconductor lasers, an array of driving elements, and other arrays of semiconductor elements.

Those skilled in the art will recognize that further variations are possible. The scope of the invention should therefore be determined from the appended claims.

What is claimed is:

1. A semiconductor device comprising:
   a substantially linear array of semiconductor blocks of a first conductive type, each of the semiconductor blocks including a diffusion region of a second conductive type and having a first electrode separated from the diffusion region, the first electrode thus making electrical contact with material of the first conductive type; and
   a plurality of first electrode pads, each one of the first electrode pads having a first electrode lead and a second electrode lead, the first electrode lead making electrical contact with the diffusion region in one of the semiconductor blocks, the second electrode lead making electrical contact with the first electrode in another one of the semiconductor blocks;
   each one of the semiconductor blocks being electrically coupled to just one of the first electrode pads;
   each one of the first electrode pads being electrically coupled to just two of the semiconductor blocks.

2. The semiconductor device of claim 1, further comprising a plurality of second electrode pads, each one of the second electrode pads having a first electrode lead making electrical contact with the first electrode in one of the semiconductor blocks and a second electrode lead making electrical contact with the diffusion region in another one of the semiconductor blocks.

3. The semiconductor device of claim 2, wherein the semiconductor blocks are arranged in the substantially linear array so that semiconductor blocks in electrical contact with the first leads of the first and second electrode pads alternate with semiconductor blocks in electrical contact with the second leads of the first and second electrode pads.

4. The semiconductor device of claim 1, further comprising:
   a second electrode pad electrically coupled to the diffusion regions of the semiconductor blocks having first electrodes in electrical contact with the first leads of the first electrode pads; and
   a third electrode pad electrically coupled to the first electrodes of the semiconductor blocks having diffusion regions in electrical contact with the second leads of the first electrode pads.

5. The semiconductor device of claim 4, further comprising:
   an isolated semiconductor region of the first conductive type disposed parallel to the substantially linear array of semiconductor blocks;
   a plurality of second electrodes disposed on and electrically interconnected through the isolated semiconductor region, one of the second electrodes being in electrical contact with the third electrode pad; and
   a plurality of third electrode leads electrically coupling the second electrodes to the first electrodes of the semiconductor blocks having diffusion regions in electrical contact with the second leads of the first electrode pads.

6. The semiconductor device of claim 1, further comprising a second electrode pad electrically coupled to the diffusion regions of the semiconductor blocks having first electrodes in electrical contact with the first leads of the first electrode pads, and to the first electrodes of the semiconductor blocks having diffusion regions in electrical contact with the second leads of the first electrode pads.

7. The semiconductor device of claim 1, wherein all of the first electrode pads are disposed on one side of the substantially linear array.

8. The semiconductor device of claim 1, wherein the two semiconductor blocks to which each one of the first one of the first electrode pads is electrically coupled are mutually adjacent.

9. The semiconductor device of claim 1, wherein the semiconductor blocks are oriented so that in each semiconductor block, the first electrode is separated from the diffusion region in a direction orthogonal to a longitudinal direction of the substantially linear array.

10. The semiconductor device of claim 9, wherein each pair of mutually adjacent semiconductor blocks have their diffusion regions on mutually opposite sides of the substantially linear array.

11. The semiconductor device of claim 1, wherein the semiconductor blocks are mutually isolated by trenches.

12. The semiconductor device of claim 1, wherein the semiconductor blocks are mutually isolated by an isolation diffusion region of the second conductive type.

13. The semiconductor device of claim 1, wherein the first electrode pads have a width parallel to a longitudinal direction of the substantially linear array, said width being less than twice a pitch of the substantially linear array.

14. The semiconductor device of claim 1, wherein the semiconductor blocks emit light responsive to voltages supplied to the first electrode pads.

15. A semiconductor device comprising:
   a substantially linear array of pairs of semiconductor blocks of a first conductive type, each of the semiconductor blocks including a diffusion region of a second conductive type and having an electrode separated from the diffusion region, the electrode thus making electrical contact with material of the first conductive type, the two semiconductor blocks in each pair being mutually adjacent and having their electrodes disposed in mutually opposite directions from their diffusion regions; and
   a plurality of conductive patterns electrically coupled to respective pairs of the semiconductor blocks, each conductive pattern being electrically coupled to the diffusion region in one of the semiconductor blocks and to the electrode in another one of the semiconductor blocks.

* * * * *